(12) United States Patent
Kawato et al.

(10) Patent No.: US 9,978,812 B2
(45) Date of Patent: May 22, 2018

(54) ORGANIC ELECTROLUMINESCENT DISPLAY PANEL

(71) Applicant: SHARP KABUSHIKI KAISHA, Osaka-shi (JP)

(72) Inventors: Shinichi Kawato, Osaka (JP); Takashi Ochi, Osaka (JP); Satoshi Inoue, Osaka (JP); Yuhki Kobayashi, Osaka (JP); Kazuki Matsunaga, Osaka (JP); Katsuhiro Kikuchi, Osaka (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days. days.

(21) Appl. No.: 15/107,717

(22) PCT Filed: Aug. 28, 2014

(86) PCT No.: PCT/JP2014/072574
§ 371 (c)(1),
(2) Date: Jun. 23, 2016

(87) PCT Pub. No.: WO2015/107719
PCT Pub. Date: Jul. 23, 2015

(65) Prior Publication Data
US 2016/0322430 A1    Nov. 3, 2016

(30) Foreign Application Priority Data

Jan. 14, 2014  (JP) ................................ 2014-004327

(51) Int. Cl.
*H01L 27/32* (2006.01)
*H01L 51/50* (2006.01)

(52) U.S. Cl.
CPC ...... *H01L 27/3211* (2013.01); *H01L 51/5012* (2013.01); *H01L 2251/5346* (2013.01)

(58) Field of Classification Search
None
See application file for complete search history.

(56) References Cited

U.S. PATENT DOCUMENTS

| 6,023,371 A * | 2/2000 | Onitsuka | C09K 11/025 250/458.1 |
| 6,541,909 B1 * | 4/2003 | Motomatsu | H01L 51/5012 313/504 |

(Continued)

FOREIGN PATENT DOCUMENTS

| JP | 2005-11735 | 1/2005 |
| JP | 2008-53664 | 3/2008 |

(Continued)

OTHER PUBLICATIONS

International Search Report dated Oct. 28, 2014, directed to International Application No. PCT/JP2014/072574; 2 pages.

*Primary Examiner* — Michael Lebentritt
(74) *Attorney, Agent, or Firm* — ScienBiziP, P.C.

(57) ABSTRACT

The organic EL display panel includes: a substrate; and an organic electroluminescent element disposed on the substrate, the organic electroluminescent element including, in the given order: an anode; a light-emitting layer; and a cathode, the light-emitting layer including multiple light-emitting portions, the multiple light-emitting portions each providing a luminescent color different from the luminescent color of the adjacent light-emitting portion, the multiple light-emitting portions each containing a luminescent dopant material, the concentration of the luminescent dopant material in each light-emitting portion changing in the thickness direction of the light-emitting portion and being at a local maximum in the vicinity of a first interface on the anode side and in the vicinity of a second interface on the (Continued)

cathode side, the local maximum in each light-emitting portion being 20% by weight or higher of the total weight of the light-emitting portion.

12 Claims, 6 Drawing Sheets

(56) References Cited

U.S. PATENT DOCUMENTS

| | | | | |
|---|---|---|---|---|
| 2004/0169936 | A1* | 9/2004 | Taniguchi | C09K 11/06 359/722 |
| 2005/0046337 | A1* | 3/2005 | Chin | H01L 51/5012 313/504 |
| 2006/0049419 | A1* | 3/2006 | Tanaka | H01L 51/5262 257/98 |
| 2007/0003743 | A1* | 1/2007 | Asano | B82Y 20/00 428/201 |
| 2008/0297029 | A1* | 12/2008 | Cok | B82Y 20/00 313/498 |
| 2010/0026175 | A1* | 2/2010 | Nakayama | C09K 11/06 313/504 |
| 2011/0315971 | A1* | 12/2011 | Rokuhara | H01L 51/0005 257/40 |
| 2012/0018712 | A1* | 1/2012 | Hamaguchi | H01L 27/3218 257/40 |
| 2012/0132900 | A1* | 5/2012 | Fujita | H05B 33/10 257/40 |
| 2012/0199837 | A1* | 8/2012 | Kobayashi | H01L 51/5052 257/59 |
| 2012/0299045 | A1* | 11/2012 | Pan | H01L 51/5032 257/98 |
| 2013/0299810 | A1 | 11/2013 | Sonoda et al. | |
| 2013/0313536 | A1 | 11/2013 | Nishimura et al. | |
| 2013/0334512 | A1* | 12/2013 | Abe | C08G 73/026 257/40 |
| 2014/0103321 | A1* | 4/2014 | Furukawa | C09K 11/06 257/40 |
| 2015/0021587 | A1* | 1/2015 | Mizukami | H01L 51/0035 257/40 |
| 2015/0162566 | A1* | 6/2015 | Kikuchi | H01L 51/5275 257/40 |
| 2015/0171359 | A1* | 6/2015 | Forrest | H01L 51/5016 257/40 |
| 2016/0035999 | A1* | 2/2016 | Ii | H01L 51/5253 257/40 |
| 2016/0248036 | A1* | 8/2016 | Goushi | H01L 51/0071 |

FOREIGN PATENT DOCUMENTS

| | | |
|---|---|---|
| JP | 2009-209133 | 9/2009 |
| WO | WO-2012/099019 | 7/2012 |
| WO | WO-2013/180097 | 12/2013 |

\* cited by examiner

ORGANIC ELECTROLUMINESCENT DISPLAY PANEL

CROSS-REFERENCE TO RELATED APPLICATIONS

This application is a National Phase filing under 35 USC 371 application of International Application No. PCT/JP2014/072574, filed on Aug. 28, 2014, which claims priority to Japanese Application No. 2014-004327, filed on Jan. 14, 2014, each of which is hereby incorporated by reference in the present disclosure in their entirety.

FIELD OF THE INVENTION

The present invention relates to organic electroluminescent display panels (hereinafter, also referred to as "organic EL display panels"). More specifically, the present invention relates to an organic EL display panel including light-emitting portions, wherein the luminescent colors of adjacent light-emitting portions are different from each other.

BACKGROUND OF THE INVENTION

Organic electroluminescent elements (hereinafter, also referred to as "organic EL elements") utilizing electroluminescence of organic materials have drawn attention as display elements used for thin display devices. Organic EL elements emit light by recombining holes injected from the anode and electrons injected from the cathode within a light-emitting layer disposed between these electrodes. Such self-luminous organic EL elements have advantages such as high-luminance light emission, a high response speed, a wide viewing angle, a thin profile, and a light weight, and are therefore expected to be applied to various fields such as display panels and illumination lamps.

A light-emitting layer for organic EL elements provided to organic EL display panels is usually a mixed layer, obtained by co-deposition, of a luminescent dopant material mainly providing luminescence and a luminescent host material mainly transporting holes and electrons. Studies have been made to enhance the functionality of such organic EL elements by changing the material composition of the light-emitting layer. For example, the following organic EL elements are known.

Patent Literature 1, for example, discloses an organic EL element including a light-emitting layer which includes light-emitting portions each made of a material obtained by doping, with a luminescent dopant material, a luminescent host material which is a mixture of materials such as a material constituting a hole transport layer and a material constituting an electron-transport layer.

CITATION LIST

Patent Literature 1: JP 2008-53664 A

SUMMARY OF THE INVENTION

In production of organic EL display panels that include multiple pixels and provide display with multiple luminescent colors, luminescent dopant materials corresponding to the respective luminescent colors may be separately vapor-deposited or applied to the respective pixels. The vapor deposition has been performed by, for example, a method of vapor-depositing luminescent dopant materials corresponding to the respective luminescent colors using a mask with fine openings (fine metal mask; FMM). In particular, a vapor deposition apparatus as illustrated in FIG. 7, for example, has been used for production of large-sized organic EL display panels.

FIG. 7 is a schematic view illustrating one example of a conventional vapor deposition apparatus. As illustrated in FIG. 7, a conventional vapor deposition apparatus 10 includes, in the order toward a substrate 2, a vapor deposition source 12 provided with nozzles 11 configured to eject vapor deposition particles; a limiting plate 14 provided with openings 13a which are formed in a stripe pattern; and a mask 15 provided with openings 13b which are formed in a stripe pattern. Vapor deposition particles ejected from the nozzles 11 of the vapor deposition source 12 form vapor deposition streams 16 to pass through the openings 13a of the limiting plate 14 and the openings 13b of the mask 15, so that the particles are vapor-deposited at the predetermined positions on the substrate 2. In this configuration, luminescent dopant materials corresponding to the respective luminescent colors are sequentially vapor-deposited while the positions of the nozzles 11 of the vapor deposition source 12, the openings 13a of the limiting plate 14, and the openings 13b of the mask 15 are adjusted and the substrate 2 or the vapor deposition apparatus 10 is relatively moved in the directions of the double-headed arrow illustrated in FIG. 7.

This vapor deposition technique, however, may cause color mixture between adjacent pixels, which decreases the purity of the luminescent colors to deteriorate the display quality. This disadvantage is presumably caused by the following phenomena (1) and (2).

(1) Due to a decrease in the accuracy of alignment between the substrate and the mask, a luminescent dopant material for the light-emitting portions of the target pixels may spread to the adjacent pixels of the target pixels.

(2) Due to insufficient contact between the substrate and the mask, a luminescent dopant material for the light-emitting portions of the target pixels may spread to the adjacent pixels of the target pixels.

The above phenomena (1) and (2) are described below based on an example of a conventional organic EL display panel providing display with luminescent colors of red (R), green (G), and blue (B).

First, the phenomenon (1) is described with reference to FIG. 8. FIG. 8 is a schematic cross-sectional view illustrating one example of an organic EL display panel in the case where color mixture occurs. As illustrated in FIG. 8, an organic EL display panel 101 includes the substrate 2 and organic EL elements 103 disposed on the substrate 2. The organic EL elements 103 each include an anode 4 formed on the substrate 2, an edge cover 18 formed to cover the ends of the anode 4, and a light-emitting layer 19 formed on the anode 4. This drawing illustrates the state where a cathode to face the anode 4 has not been formed on the light-emitting layer 19 yet in each organic EL element 103. The edge cover 18 is provided with openings 13R, 13G, and 13B which respectively correspond to the light-emitting regions of pixels 17R, 17G, and 17B. The light-emitting layer 19 includes light-emitting portions 6R providing a luminescent color R, light-emitting portions 6G providing a luminescent color G, and light-emitting portions 6B providing a luminescent color B. The luminescent colors of adjacent light-emitting portions are different from each other. Such a light-emitting layer 19 is obtained by, for example, sequentially vapor-depositing luminescent dopant materials for the light-emitting portions 6R corresponding to the pixels 17R, the light-emitting portions 6G corresponding to the pixels 17G, and the light-emitting portions 6B corresponding to the pixels 17B, using the mask 15 provided with the openings 13b. Here, in formation of the light-emitting portions 6R, for example, if the substrate 2 and the mask 15 are misaligned to shift the formation position of a light-emitting portion 6R to the right in FIG. 8, the luminescent dopant material for the light-emitting portion 6R may spread to the adjacent pixel 17G. If the light-emitting portion 6G is formed thereon, the light-emitting portion 6R and the light-emitting portion 6G may cause color mixture on the anode 4 side of the light-emitting portion 6G as indicated by a color mixture region AR2. Since the luminescent dopant material is uniformly distributed in normal light-emitting portions (e.g. light-emitting portions 6G), in the color mixture region AR2, the concentration of the luminescent dopant material constituting the light-emitting portion 6R cannot be ignored, and thus the desired luminescent color of the light-emitting portion 6G may not be obtained. The misalignment between the substrate 2 and the mask 15 can be due to a decrease in the alignment accuracy between the units (vapor deposition source, limiting plate, and mask) in the vapor deposition apparatus, and a warp caused by deterioration of the mask, for example.

A case in which color mixture occurs in a region different from the region illustrated in FIG. 8 is described with reference to FIG. 9. FIG. 9 is a schematic cross-sectional view illustrating one example of an organic EL display panel in the case where color mixture occurs in a region different from the region illustrated in FIG. 8. FIG. 9 is the same as FIG. 8 except for the positions of the light-emitting portions 6R and 6G, and thus the same points as in FIG. 8 are not described here. In the case of forming the light-emitting portion 6G after formation of the light-emitting portions 6R, for example, if the substrate 2 and the mask 15 are misaligned to shift the formation position of the light-emitting portion 6G to the left in FIG. 9, the luminescent dopant material for the light-emitting portion 6G may spread to the adjacent pixel 17R. As a result, the light-emitting portion 6R and the light-emitting portion 6G may cause color mixture on the side opposite to the anode 4 side of the light-emitting portion 6R as indicated by a color mixture region AR3. For this reason, in the color mixture region AR3, the concentration of the luminescent dopant material constituting the light-emitting portion 6G cannot be ignored, and thus the desired luminescent color of the light-emitting portion 6R may not be obtained.

Next, the above phenomenon (2) is described with reference to FIG. 10. FIG. 10 is a schematic cross-sectional view illustrating one example of an organic EL display panel in the case where color mixture occurs due to a factor different from the factor described with reference to FIG. 8. FIG. 10 is the same as FIG. 8 except for the positions of the light-emitting portions 6R, and thus the same points as in FIG. 8 are not described here. In formation of the light-emitting portions 6R, due to insufficient contact between the substrate 2 and the mask 15, the luminescent dopant material for a light-emitting portion 6R may spread to the adjacent pixel 17G. If the light-emitting portion 6G is formed thereon, the light-emitting portion 6R and the light-emitting portion 6G may cause color mixture on the anode 4 side of the light-emitting portion 6G as indicated by a color mixture region AR4. For this reason, in the color mixture region AR4, the concentration of the luminescent dopant material constituting the light-emitting portion 6R cannot be ignored, and thus the desired luminescent color of the light-emitting portion 6G may not be obtained. In particular, the method using the vapor deposition apparatus 10 as already described with reference to FIG. 7 may be performed in the state where the substrate 2 and the mask 15 are not in contact with each other, so that the color mixture as described above is more likely to occur.

A case in which color mixture occurs in a region different from the region illustrated in FIG. 10 is described with reference to FIG. 11. FIG. 11 is a schematic cross-sectional view illustrating one example of an organic EL display panel in the case where color mixture occurs in a region different from the region illustrated in FIG. 10. FIG. 11 is the same as FIG. 10 except for the positions of the light-emitting portions 6R and 6G, and thus the same points as in FIG. 10 are not described here. In formation of the light-emitting portion 6G after formation of the light-emitting portions 6R, due to insufficient contact between the substrate 2 and the mask 15, the luminescent dopant material for a light-emitting portion 6G may spread to the adjacent pixel 17R. As a result, the light-emitting portion 6R and the light-emitting portion 6G may cause color mixture on the side opposite to the anode 4 side of the light-emitting portion 6R as indicated by a color mixture region AR5. For this reason, in the color mixture region AR5, the concentration of the luminescent dopant material constituting the light-emitting portion 6G cannot be ignored, and thus the desired luminescent color of the light-emitting portion 6R may not be obtained.

As described above, the conventional organic EL display panels can still be improved to sufficiently suppress the influence of color mixture and to improve the display quality.

Patent Literature 1 discloses that it provides an organic EL element that can enhance the life characteristics and further avoid influences of voltage increase, lowering of the luminous efficacy, and the other factors, by controlling the structure of the region to be doped with a luminescent dopant material, the region to be doped, and the doping concentration distribution. The invention described in Patent Literature 1, however, does not mention these problems to be solved, and therefore needs to be improved to solve these problems. Also, in the invention described in Patent Literature 1, the light-emitting layer has a configuration in which light-emitting portions are stacked. Such a configuration commonly involves carrier (holes and electrons) trapping in the interfaces between the light-emitting portions and generation of diffusion and accumulation of the luminescent dopant materials, which may lead to deterioration of the initial characteristics of the organic EL elements and a shortened life span.

The present invention was made in view of the above current state of the art, and aims to provide an organic EL display panel that can sufficiently suppress the influence of color mixture and enhance the display quality.

The inventors have made various studies on organic EL display panels that can sufficiently suppress the influence of color mixture and enhance the display quality. As a result, the inventors have focused on a configuration in which the concentration of the luminescent dopant material in each of the light-emitting portions constituting the light-emitting layer is set higher on the anode and cathode sides where color mixture tends to occur than the concentrations in the other regions. The inventors have then found that the influence of color mixture can be sufficiently suppressed and the display quality can be enhanced by use of a configuration in which the concentration of the luminescent dopant material changes in the thickness direction of each of the light-emitting portions and is at a local maximum in the vicinities of the interfaces on both the anode and cathode sides, and the local maximum in each of the light-emitting portions is 20% by weight or higher of the total weight of the light-emitting portion obtained in the thickness for which the concentration of the luminescent dopant material has been measured. Thereby, the above problems can be solved, so that the present invention was completed.

That is, one aspect of the present invention may be an organic electroluminescent display panel including: a substrate; and an organic electroluminescent element disposed on the substrate, the organic electroluminescent element including, in the given order: an anode; a light-emitting layer; and a cathode, the light-emitting layer including multiple light-emitting portions, the multiple light-emitting portions each providing a luminescent color different from the luminescent color of the adjacent light-emitting portion, the multiple light-emitting portions each containing a luminescent dopant material, the concentration of the luminescent dopant material in each light-emitting portion changing in the thickness direction of the light-emitting portion and being at a local maximum in the vicinity of a first interface on the anode side and in the vicinity of a second interface on the cathode side, the local maximum in each light-emitting portion being 20% by weight or higher of the total weight of the light-emitting portion obtained in the thickness for which the concentration has been measured.

The present invention can provide an organic EL display panel that can sufficiently suppress the influence of color mixture and enhance the display quality.

DETAILED DESCRIPTION OF THE INVENTION

The present invention will be described in more detail below with reference to the drawings based on embodiments. The embodiments, however, are not intended to limit the scope of the present invention. The configurations in the embodiments may be appropriately combined or altered within the spirit of the present invention.

Figure 7:
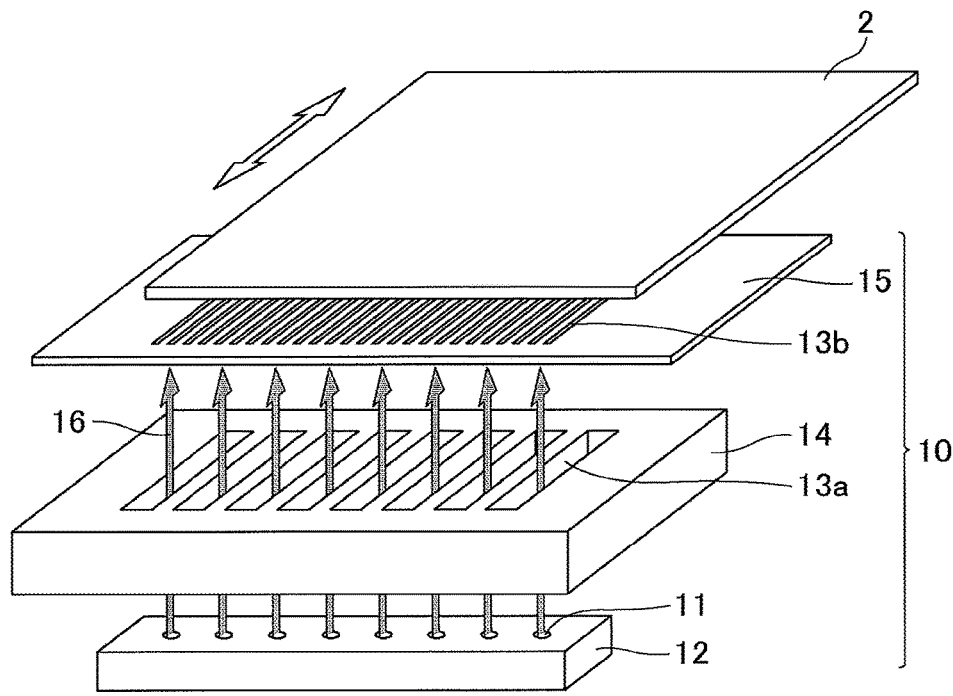
FIG. 7 is a schematic view illustrating one example of a conventional vapor deposition apparatus.
Figure 8:
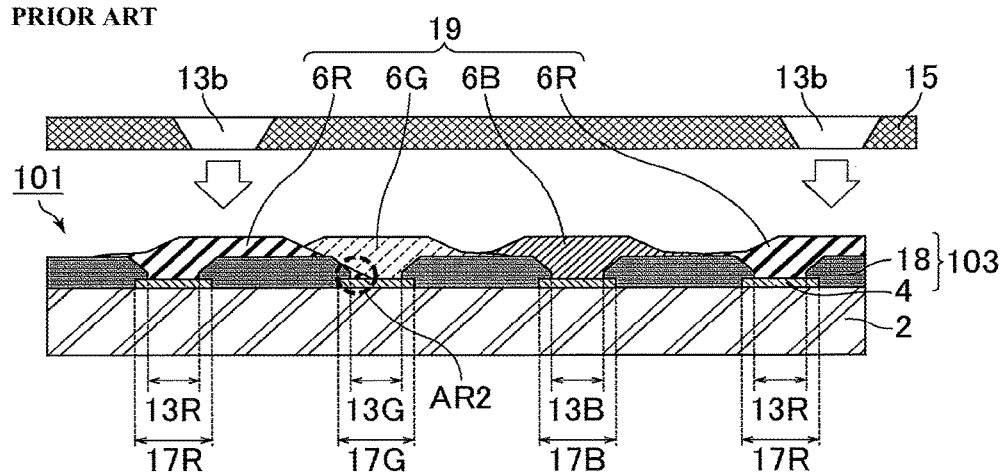
FIG. 8 is a schematic cross-sectional view illustrating one example of an organic EL display panel in the case where color mixture occurs.
Figure 9:
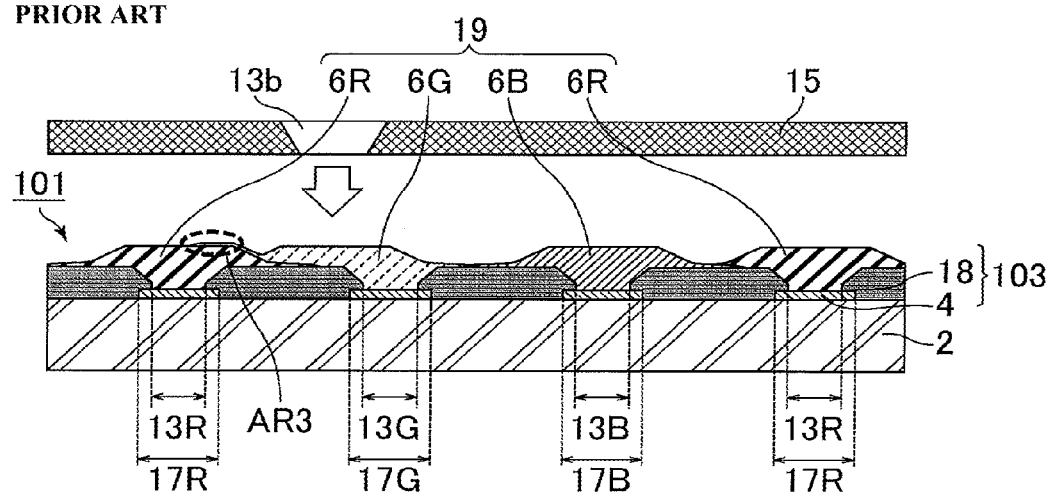
FIG. 9 is a schematic cross-sectional view illustrating one example of an organic EL display panel in the case where color mixture occurs in a region different from the region illustrated in FIG. 8.
Figure 10:
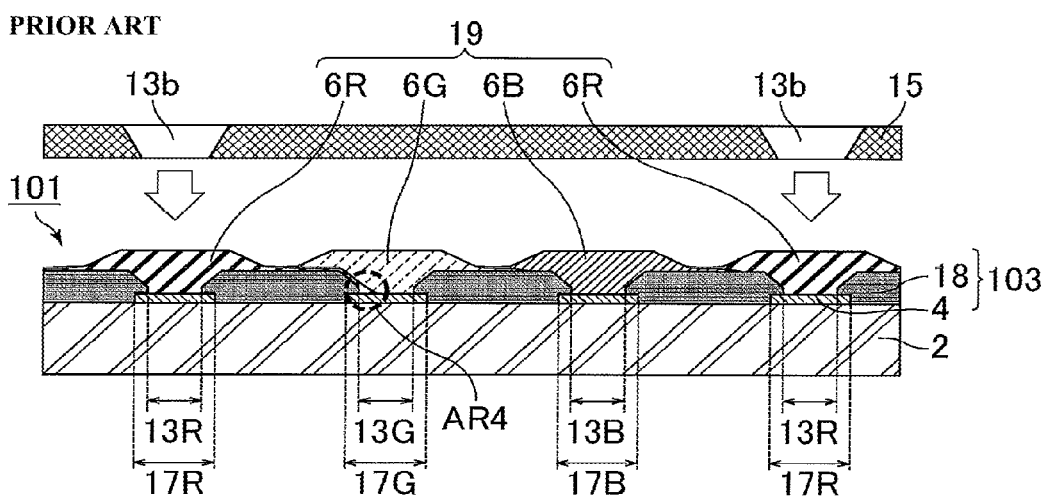
FIG. 10 is a schematic cross-sectional view illustrating one example of an organic EL display panel in the case where color mixture occurs due to a factor different from the factor described with reference to FIG. 8.
Figure 11:
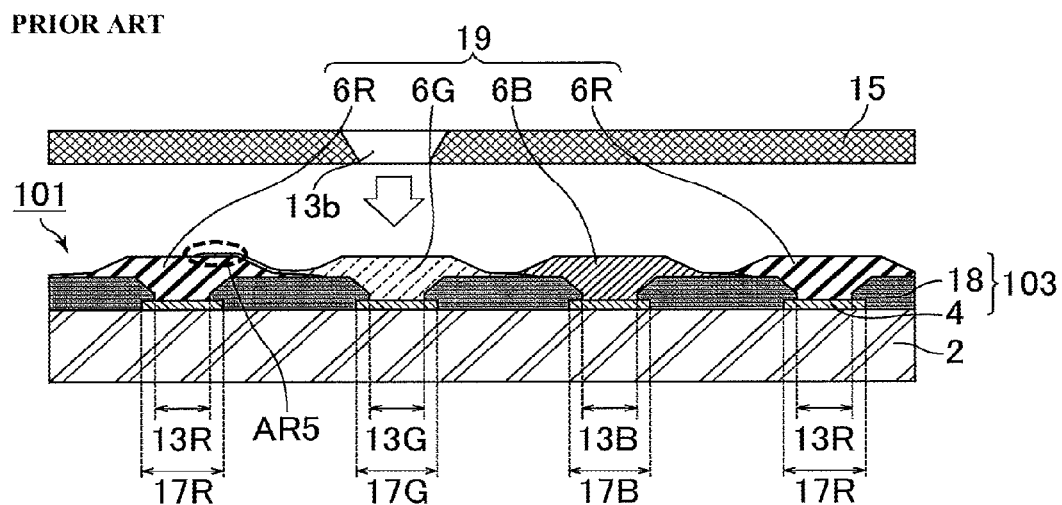
FIG. 11 is a schematic cross-sectional view illustrating one example of an organic EL display panel in the case where color mixture occurs in a region different from the region illustrated in FIG. 10.

The organic EL display panel of the present invention is suitably produced by the method utilizing the vapor deposition apparatus as already described with reference to FIG. 7, but may be produced by any other method. Herein, the vicinity of the interface on the anode side and the vicinity of the interface on the cathode side in the light-emitting portion respectively refer to the ranges within 2 nm from the interface on the anode side and the interface on the cathode side. Also, the concentration of the luminescent dopant material is determined for each certain thickness, and is represented as percentage by weight of the total weight of the light-emitting portion obtained in the thickness for which the concentration has been measured. The concentration of the luminescent dopant material may be measured with a resolution of 1 nm, and examples of the measurement method include secondary ion mass spectrometry (SIMS). The thickness of each component constituting an organic EL element is defined to be in the direction perpendicular to the main surface of the substrate. Here, the main surface of a substrate refers to a surface on the organic EL element side of the substrate. Organic electroluminescence as used herein is also referred to as "organic EL". Organic EL is also called an organic light emitting diode (OLED).

Embodiment 1 relates to an organic EL display panel including an anode, a light-emitting portion, and a cathode in the order from the substrate side, and to a configuration in which the concentration of the luminescent dopant material is at a local maximum in the vicinities of the interfaces on the anode side and on the cathode side, and is symmetrically distributed, in the thickness direction of the light-emitting portion.

Figure 1:
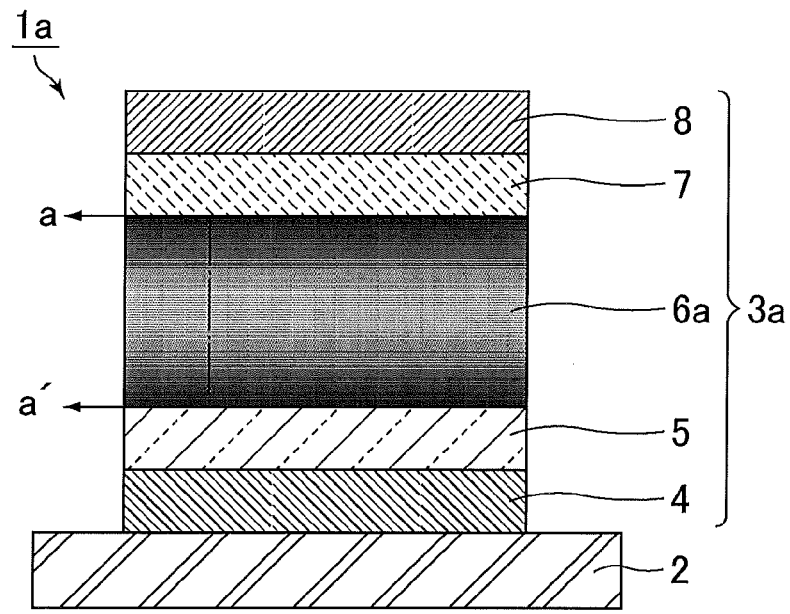
FIG. 1 is a schematic cross-sectional view illustrating a pixel in an organic EL display panel of Embodiment 1.

FIG. 1 is a schematic cross-sectional view illustrating a pixel in an organic EL display panel of Embodiment 1. Here, the pixel illustrated in FIG. 1 corresponds to one pixel in an organic EL display panel in which the luminescent colors of adjacent light-emitting portions are different from each other as already described with reference to FIGS. 8 to 11. As long as the luminescent colors of adjacent light-emitting portions are different from each other, the order of disposing the light-emitting portions and the kind of the luminescent colors are not particularly limited. As illustrated in FIG. 1, an organic EL display panel 1a includes the substrate 2 and an organic EL element 3a disposed on the substrate 2. The organic EL element 3a includes the anode 4, a hole transport layer 5, a light-emitting portion 6a, an electron transport layer 7, and a cathode 8 in the given order from the substrate 2 side.

The substrate 2 is an active matrix substrate provided with thin-film transistors. The organic EL element 3a is driven by connecting the anode 4 and the corresponding thin-film transistor. The substrate 2 can alternatively be, for example, a transparent substrate. Examples of the transparent substrate include glass substrates and plastic substrates. In the case that the transparent substrate is a flexible plastic substrate, a flexible organic EL display panel can be obtained.

The organic EL display panel 1a of Embodiment 1 is a top emission organic EL display panel which emits light from the cathode 8 side in the case that the anode 4 is light reflective and the cathode 8 is light transmissive. The organic EL display panel 1a is a bottom emission organic EL display panel which emits light from the anode 4 side in the case that the anode 4 is light transmissive and the cathode 8 is light reflective.

The electrode having light reflectivity can be made of, for example, a metal such as aluminum (Al) or indium (In). The electrode having light transmissivity can be made of, for example, indium tin oxide (ITO) or indium zinc oxide (IZO).

The hole transport layer 5 can be one included in a common organic EL element, and may be made of, for example, 4,4'-bis[N-(1-naphthyl)-N-phenyl-amino]-biphenyl (α-NPD).

The electron transport layer 7 can be one included in a common organic EL element, and may be made of, for example, bathophenanthroline (Bphen).

The luminescent dopant material for the light-emitting portion 6a may either be a fluorescent dopant material or a phosphorescent dopant material. Examples of the fluorescent dopant material include diamine pyrene-based blue delayed fluorescence materials. Examples of the phosphorescent dopant material include tris(2-phenylpyridinato) iridium(III) (Ir(ppy)3). The light-emitting portion 6a may contain a luminescent host material as well as the luminescent dopant material. Examples of the luminescent host material include 1,3,5-tris(N-phenylbenzimidazol-2-yl)benzene (TPBI).

Figure 2:
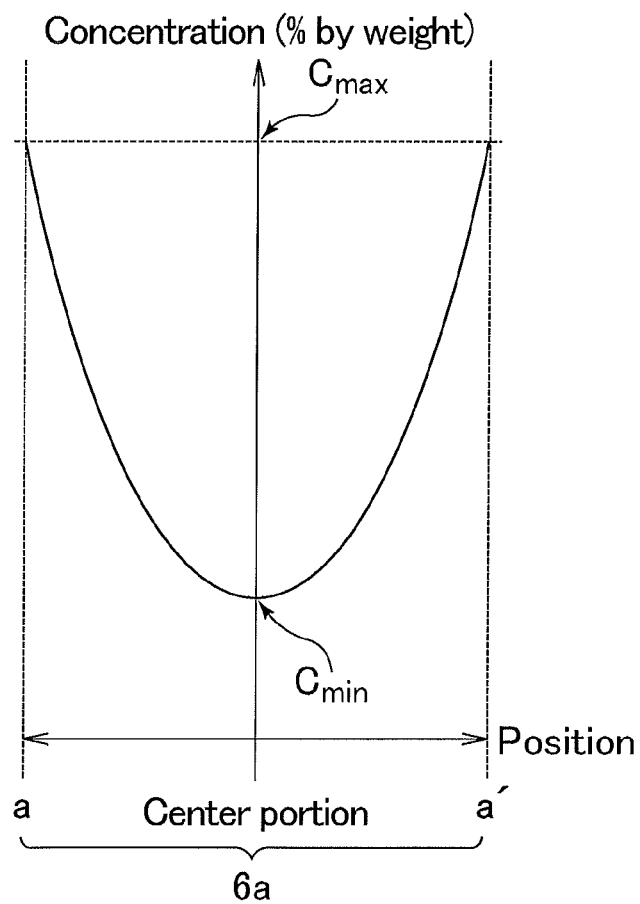
FIG. 2 is a graph showing the concentration of a luminescent dopant material corresponding to the a-a' line in FIG. 1.

Next, the concentration of the luminescent dopant material constituting the light-emitting portion 6a is described with reference to FIG. 2. FIG. 2 is a graph showing the concentration of a luminescent dopant material corresponding to the a-a' line in FIG. 1. The vertical axis in FIG. 2 indicates the concentration of the luminescent dopant material and the horizontal axis indicates the position on the a-a' line in FIG. 1. As illustrated in FIG. 2, the concentration of the luminescent dopant material has the following characteristics (A) and (B) in the a-a' line direction, i.e., in the thickness direction of the light-emitting portion 6a.

(A) The concentration is at a local maximum $C_{max}$ (% by weight) in the vicinities of the interface (first interface) on the anode side of the light-emitting portion 6a and the interface (second interface) on the cathode side of the light-emitting portion 6a.

(B) The concentration continuously decreases from the interface on the anode side of the light-emitting portion 6a and from the interface on the cathode side of the light-emitting portion 6a to the center portion of the light-emitting portion 6a, is at a local minimum $C_{min}$ (% by weight) in the center portion of the light-emitting portion 6a, and is symmetrically distributed.

The effects of the characteristics (A) and (B) are described below.

Figure 3:
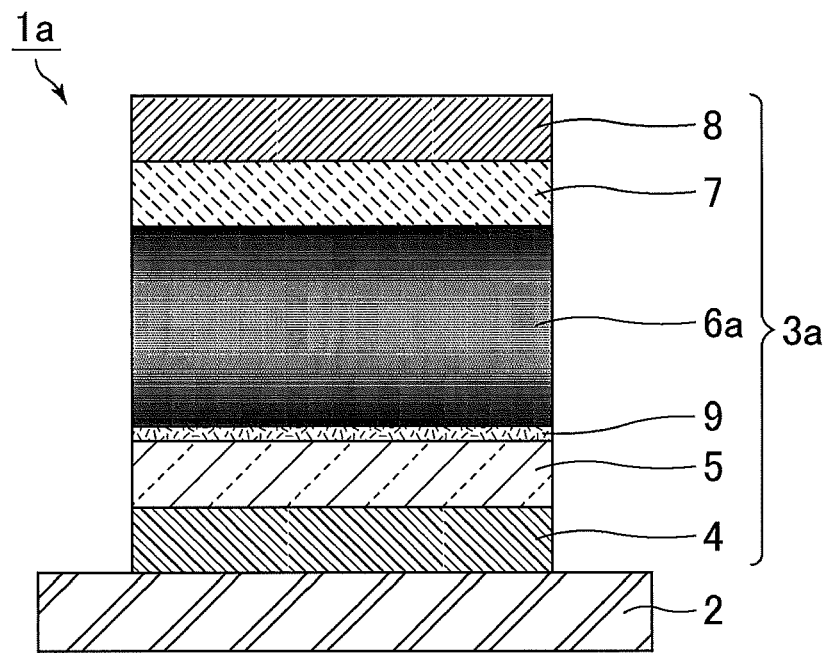
FIG. 3 is a schematic cross-sectional view illustrating the organic EL display panel of Embodiment 1 in the case where color mixture occurs on the anode side in a light-emitting portion.
Figure 4:
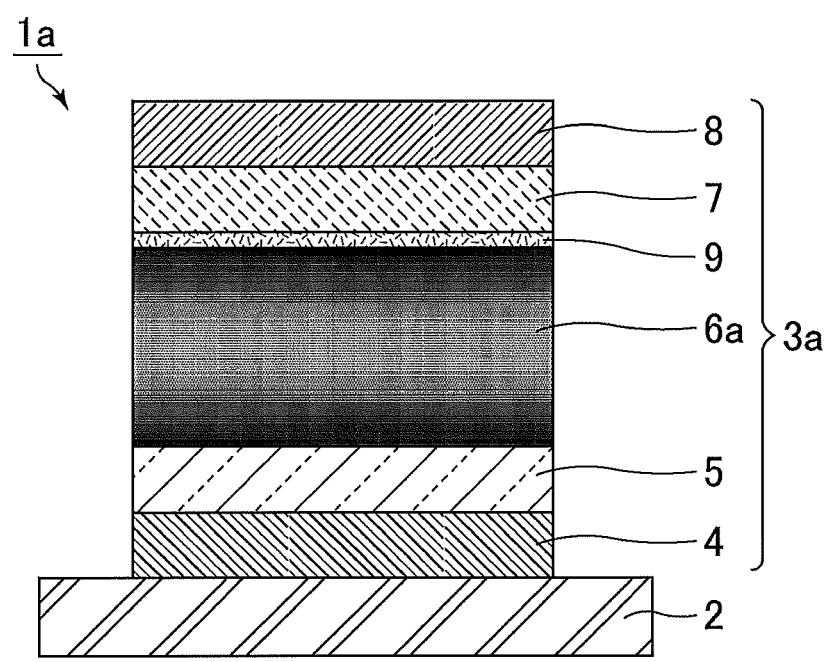
FIG. 4 is a schematic cross-sectional view illustrating the organic EL display panel of Embodiment 1 in the case where color mixture occurs on the cathode side in a light-emitting portion.

First, the effect of the characteristic (A) is described with reference to FIG. 3 and FIG. 4. FIG. 3 is a schematic cross-sectional view illustrating the organic EL display panel of Embodiment 1 in the case where color mixture occurs on the anode side in a light-emitting portion. FIG. 3 is the same as FIG. 1 except that a thin mixed layer 9 is disposed on the anode 4 side of the light-emitting portion 6a, and thus the same points as in FIG. 1 are not described here. The thin mixed layer 9 is a layer in which the luminescent dopant material constituting the light-emitting portion 6a is mixed with another luminescent dopant material constituting the adjacent light-emitting portion. Color mixture occurs here. Since the concentration of the luminescent dopant material constituting the light-emitting portion 6a has the above characteristic (A), the concentration of the luminescent dopant material constituting the adjacent light-emitting portion in the thin mixed layer 9 is comparatively small on the anode 4 side of the light-emitting portion 6a, and thus can be ignored. As a result, the desired luminescent color for the light-emitting portion 6a can be obtained.

A case in which color mixture occurs in a region different from the region illustrated in FIG. 3 is described with reference to FIG. 4. FIG. 4 is a schematic cross-sectional view illustrating the organic EL display panel of Embodiment 1 in the case where color mixture occurs on the cathode side in a light-emitting portion. FIG. 4 is the same as FIG. 3 except that the thin mixed layer 9 is disposed on the cathode 8 side of the light-emitting portion 6a, and thus the same points as in FIG. 3 are not described here. Since the concentration of the luminescent dopant material constituting the light-emitting portion 6a has the above characteristic (A), the concentration of the luminescent dopant material constituting the adjacent light-emitting portion in the thin mixed layer 9 is comparatively small on the cathode 8 side of the light-emitting portion 6a, and thus can be ignored. As a result, the desired luminescent color for the light-emitting portion 6a can be obtained.

Here, the local maximum $C_{max}$ is 20% by weight or higher, and is preferably 50% by weight or higher. If the local maximum $C_{max}$ is lower than 20% by weight, the concentration may be equal to or lower than the concentration of the luminescent dopant material in a common organic EL element, leading to a failure in achieving the effects of the present invention. In the case that the local maximum $C_{max}$ is 50% by weight or higher, the influence of the color mixture can be further suppressed. The local maximum $C_{max}$ is preferably lower than 90% by weight. If the local maximum $C_{max}$ is 90% by weight or higher, the luminescent dopant material itself may cause carrier trapping, thereby lowering the luminous efficacy. In the case that there are multiple luminescent dopant materials constituting the light-emitting portion 6a, the local maximum $C_{max}$ is defined based on the total concentration of these luminescent dopant materials. Also, from the viewpoint of sufficient prevention of the carrier trapping effect of the luminescent dopant material itself, the region with a high concentration of the luminescent dopant material is preferably narrow. Specifically, the thickness of the region is suitably designed depending on the factors such as the materials (luminescent dopant material and luminescent host material) constituting the light-emitting portion and the thickness of the light-emitting portion. For example, a region having a concentration of the luminescent dopant material of 20% by weight or higher preferably has a thickness of 10 nm or smaller, while a region having a concentration of the luminescent dopant material of 50% by weight or higher preferably has a thickness of 5 nm or smaller.

As described above, the organic EL display panel of Embodiment 1 can sufficiently suppress the influence of color mixture and enhance the display quality. Also, since the desired luminescent colors can be obtained, a high-performance organic EL display panel that do not cause a decrease in the color characteristics or reduction in the color reproduction range can be obtained.

Next, the effect of the above characteristic (B) is described. When the concentration of the luminescent dopant material constituting the light-emitting portion 6a has the above characteristic (B), localization in the carrier distribution and the light emission distribution can be prevented, and stable light emission can be achieved under drive conditions in a wide range. If localization in the carrier distribution and the light emission distribution occurs, the states such as light emission distribution may be significantly changed depending on the drive conditions, whereby the characteristics may significantly be varied. Also, stress may be applied to part of the light-emitting portion, lowering the reliability.

Here, the local minimum $C_{min}$ changes depending on factors such as the material constituting the light-emitting portion 6a and the luminescent color thereof, but is preferably lower than 20% by weight. In the case that there are multiple luminescent dopant materials constituting the light-emitting portion 6a, the local minimum $C_{min}$ is defined based on the total concentration of these luminescent dopant materials. Although the concentration of the luminescent dopant material is defined to be symmetrically distributed, the concentration may be substantially symmetrically distributed as in a configuration in which the concentration is at a local minimum $C_{min}$ in a range within 5 nm from the center portion of the light-emitting portion 6a, a configuration in which the difference between the local maximum in the vicinity of the interface on the anode 4 side and the local maximum in the vicinity of the interface on the cathode 8 side is within 20% by weight, or a configuration obtained by combining these configurations. Such a substantially symmetrical distribution can also achieve the effect of the characteristic (B).

As described above, the organic EL display panel of Embodiment 1 can achieve the effect of the above characteristic (B) as well as the effect of the above characteristic (A). In the organic EL display panel of Embodiment 1, the concentration of the luminescent dopant material is not increased throughout the entire light-emitting portion 6a but is increased on the anode 4 side and the cathode 8 side where color mixture occurs easily. Hence, the increase is considered not to have an influence on the light emission characteristics.

Here, the light-emitting portion 6a having a concentration distribution of the luminescent dopant material as illustrated in FIG. 2 may be obtained by, in the case of using a vapor deposition apparatus, for example, a method of simply changing the vapor deposition rate of each material constituting the light-emitting portion 6a. Simple adjustment of the film formation conditions enables achievement of the concentration distribution of the luminescent dopant material as illustrated in FIG. 2.

The organic EL element 3a may appropriately include a hole injection layer, an electron injection layer, a hole-blocking layer, and an electron-blocking layer in addition to the components described in Embodiment 1, and a layer having two or more functions, such as a hole injection/hole transport layer obtained by integrating a hole injection layer and the hole transport layer 5 or an electron injection/electron transport layer obtained by integrating an electron injection layer and the electron transport layer 7. It is also apparent that the same effects as those achieved by the organic EL display panel of Embodiment 1 can be achieved by a configuration obtained by reversing the order of layers in the organic EL element 3a, in other words, a configuration including the cathode 8, the electron transport layer 7, the light-emitting portion 6a, the hole transport layer 5, and the anode 4 in the order from the substrate 2 side.

Embodiment 2 relates to an organic EL display panel including an anode, a light-emitting portion, and a cathode in the order from the substrate side, and to a configuration in which the concentration of the luminescent dopant material is at a local maximum in the vicinities of the interfaces on the anode side and on the cathode side, and is symmetrically distributed differently from the distribution in Embodiment 1, in the thickness direction of the light-emitting portion. The organic EL display panel of Embodiment 2 is the same as that of Embodiment 1 except for the concentration distribution of the luminescent dopant material, and thus the same points are not described here.

Figure 5:
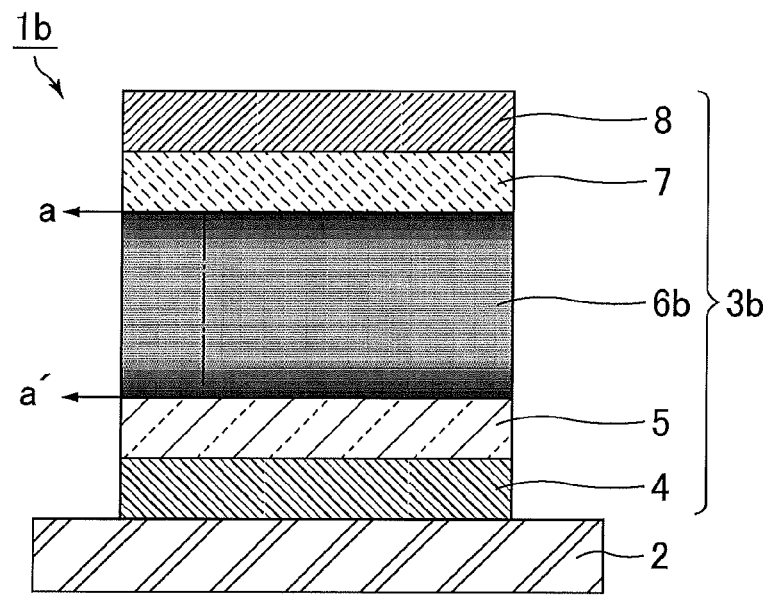
FIG. 5 is a schematic cross-sectional view illustrating a pixel in an organic EL display panel of Embodiment 2.

FIG. 5 is a schematic cross-sectional view illustrating a pixel in an organic EL display panel of Embodiment 2. As illustrated in FIG. 5, an organic EL display panel 1b includes the substrate 2 and an organic EL element 3b disposed on the substrate 2. The organic EL element 3b includes the anode 4, the hole transport layer 5, a light-emitting portion 6b, the electron transport layer 7, and the cathode 8 in the order from the substrate 2 side.

Figure 6:
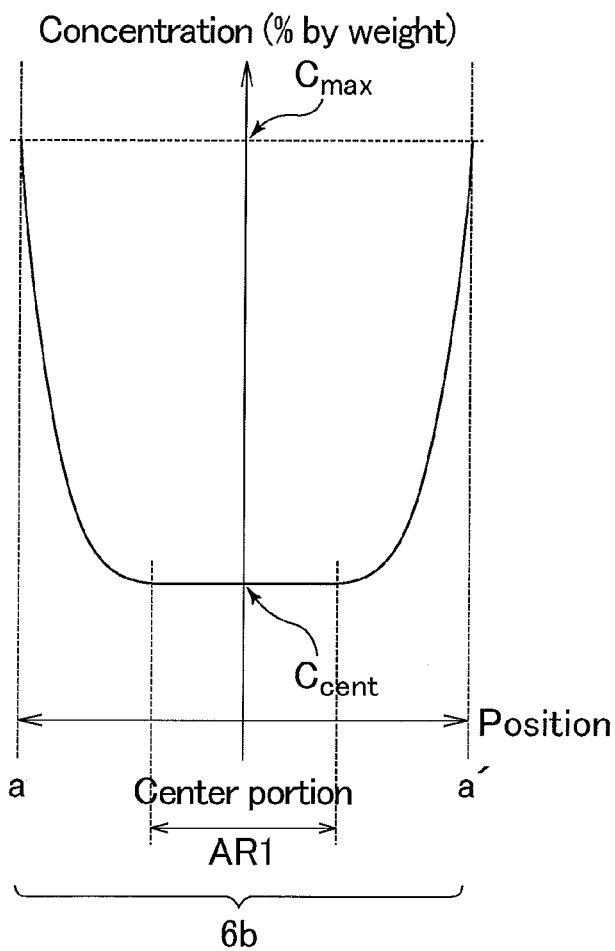
FIG. 6 is a graph showing the concentration of a luminescent dopant material corresponding to the a-a' line in FIG. 5.

Next, the concentration of the luminescent dopant material constituting the light-emitting portion 6b is described with reference to FIG. 6. FIG. 6 is a graph showing the concentration of a luminescent dopant material corresponding to the a-a' line in FIG. 5. The vertical axis in FIG. 6 indicates the concentration of the luminescent dopant material and the horizontal axis indicates the position on the a-a' line in FIG. 5. As illustrated in FIG. 6, the concentration of the luminescent dopant material has the following characteristics (C) and (D) in the a-a' line direction, i.e., in the thickness direction of the light-emitting portion 6b.

(C) The concentration is at a local maximum $C_{max}$ (% by weight) in the vicinities of the interface (first interface) on the anode side of the light-emitting portion 6b and the interface (second interface) on the cathode side of the light-emitting portion 6b.

(D) The concentration continuously decreases from the interface on the anode side of the light-emitting portion 6b and from the interface on the cathode side of the light-emitting portion 6b, and is symmetrically distributed. In addition, in a region including the center portion of the light-emitting portion 6b, the concentration shows a constant concentration region with a concentration of the luminescent dopant material of $C_{cent}$ (the concentration of the luminescent dopant material in the center portion: % by weight).

The effects of the characteristics (C) and (D) are described below.

First, the effect of the above characteristic (C) is described. The characteristic (C) is the same as the characteristic (A) already described in Embodiment 1. Hence, the concentration of the luminescent dopant material constituting the light-emitting portion 6b having the above characteristic (C) of course can achieve the same effect as that having the above characteristic (A).

As described above, the organic EL display panel of Embodiment 2 can sufficiently suppress the influence of color mixture and enhance the display quality. Also, since the desired luminescent colors can be obtained, a high-performance organic EL display panel that does not cause a decrease in the color characteristics or reduction in the color reproduction range can be obtained.

Next, the effect of the above characteristic (D) is described. The characteristic (D) is the same as the characteristic (B) already described in Embodiment 1 except that the concentration shows a constant concentration region in the region including the center portion of the light-emitting portion 6b. Hence, the concentration of the luminescent dopant material constituting the light-emitting portion 6b having the above characteristic (D) of course can achieve the same effect as that having the above characteristic (B). The organic EL display panel of Embodiment 2 can achieve the following additional effects as well as the above effects.

In the light-emitting portion of the organic EL display panel, the light-emitting position (the positions where the carriers recombine) may be different under different drive conditions. For example, the light-emitting position may be moved from the center portion of the light-emitting portion to the anode side or the cathode side as the drive voltage is increased. In the organic EL display panel of Embodiment 1, the concentration of the luminescent dopant material constituting the light-emitting portion 6a gradually increases as the measured position is moved farther from the center portion of the light-emitting portion 6a as illustrated in FIG. 2, so that the luminescent spectrum and the luminous efficacy may be more variable. In contrast, in the organic EL display panel of Embodiment 2, since the concentration of the luminescent dopant material constituting the light-emitting portion 6b shows a constant concentration region in the region including the center portion of the light-emitting portion 6b as illustrated in FIG. 6, the change in the luminous spectrum and the luminous efficacy can be suppressed in the case that the light-emitting position is moved within such a constant concentration region. As a result, stable light emission characteristics can be maintained under drive conditions in a wide range. Such a range of the constant concentration region can be suitably designed in consideration of the combination of the materials (luminescent dopant material and luminescent host material) constituting the light-emitting portion and the mixing ratio (ratio by weight) of the materials, and can be set to the optimum for the light-emitting position in consideration of the drive conditions.

Here, the concentration $C_{cent}$ of the luminescent dopant material in the center portion of the light-emitting portion 6b changes depending on the materials constituting the light-emitting portion 6b, the luminescent color thereof, and the other factors, but is preferably lower than 20% by weight. In the case that there are multiple luminescent dopant materials constituting the light-emitting portion 6b, the concentration $C_{cent}$ is defined based on the total concentration of these luminescent dopant materials. Although the concentration of the luminescent dopant material is defined to be symmetrically distributed, the concentration may be substantially symmetrically distributed as in a configuration in which the center position of the constant concentration region is in a range within 5 nm from the center portion of the light-emitting portion 6b, a configuration in which the difference between the local maximum in the vicinity of the interface on the anode 4 side and the local maximum in the vicinity of the interface on the cathode 8 side is within 20% by weight, or a configuration obtained by combining these configurations. Such a substantially symmetrical distribution can also achieve the effect of the characteristic (D). Also, the constant concentration region in which the concentration of the luminescent dopant material is $C_{cent}$ changes depending on the materials constituting the light-emitting portion 6b, the luminescent color thereof, and the other factors. For example, the constant concentration region may be a region having a concentration range of $C_{cent} \pm 10\%$ by weight and a thickness of 20 nm or greater.

As described above, the organic EL display panel of Embodiment 2 can achieve the effect of the above characteristic (D) as well as the effect of the above characteristic (C). In the organic EL display panel of Embodiment 2, the concentration of the luminescent dopant material is not increased throughout the entire light-emitting portion 6b but is increased on the anode 4 side and the cathode 8 side where color mixture occurs easily. Hence, the increase is considered not to have an influence on the light emission characteristics.

Here, the light-emitting portion 6b having a concentration distribution of the luminescent dopant material as illustrated in FIG. 6 may be obtained by, in the case of using a vapor deposition apparatus, for example, a method of simply changing the vapor deposition rate of each material constituting the light-emitting portion 6b. Simple adjustment of the film formation conditions enables achievement of the concentration distribution of the luminescent dopant material as illustrated in FIG. 6.

Hereinafter, examples of the preferred modes of the organic EL display panel of the present invention are described. These examples may be appropriately combined within the spirit of the present invention.

The concentration of the luminescent dopant material in each light-emitting portion may be substantially symmetrically distributed in the thickness direction of the light-emitting portion. The concentration of the luminescent dopant material in each light-emitting portion may continuously decrease from the first and second interface sides to the center portion of the light-emitting portion and may be at a local minimum in the center portion, in the thickness direction of the light-emitting portion. Thereby, localization in the carrier distribution and the light emission distribution can be prevented, and stable light emission can be achieved under drive conditions in a wide range.

The concentration of the luminescent dopant material in each light-emitting portion may continuously decrease from the first and second interface sides and may show a constant concentration region in a region including the center portion of the light-emitting portion, in the thickness direction of the light-emitting portion. Thereby, localization in the carrier distribution and the light emission distribution can be prevented, and stable light emission can be achieved under drive conditions in a wide range. Furthermore, changes in the luminous spectrum and the luminous efficacy can be suppressed when the light-emitting position is moved from the center portion depending on the drive conditions, and stable light emission characteristics can be maintained under drive conditions in a wide range.

The constant concentration region may have a thickness of 20 nm or greater. Thereby, changes in the luminous spectrum and the luminous efficacy can be further suppressed when the light-emitting position is moved from the center portion depending on the drive conditions, and stable light emission characteristics can be further maintained under drive conditions in a wide range.

The local maximum in each light-emitting portion may be 50% by weight or higher of the total weight of the light-emitting portion obtained in the thickness for which the concentration has been measured. Thereby, the influence of color mixture can be further suppressed.

The local maximum in each light-emitting portion may be lower than 90% by weight of the total weight of the light-emitting portion obtained in the thickness for which the concentration has been measured. If the local maximum is 90% by weight or higher, the luminescent dopant material itself may cause carrier trapping, thereby lowering the luminous efficacy.

A region having a concentration of the luminescent dopant material of 20% by weight or higher may have a thickness of 10 nm or smaller. A region having a concentration of the luminescent dopant material of 50% by weight or higher may have a thickness of 5 nm or smaller. Thereby, the carrier trapping effect of the luminescent dopant material itself can be sufficiently prevented, and thus a decrease in the luminous efficacy can be prevented.

REFERENCE SIGNS LIST 1a, 1b, 101: organic EL display panel
2: substrate
3a, 3b, 103: organic EL element
4: anode 5: hole transport layer
6a, 6b, 6R, 6G, 6B: light-emitting portion
7: electron transport layer
8: cathode
9: thin mixed layer
10: vapor deposition apparatus
11: nozzle
12: vapor deposition source
13a, 13b, 13R, 13G, 13B: opening
14: limiting plate
15: mask
16: vapor deposition stream
17R, 17G, 17B: pixel
18: edge cover
19: light-emitting layer
AR1: constant concentration region
AR2, AR3, AR4, AR5: color mixture region

The invention claimed is:

1. An organic electroluminescent display panel comprising:
    a substrate; and
    an organic electroluminescent element disposed on the substrate,
    the organic electroluminescent element comprising, in the given order:
        an anode;
        a light-emitting layer; and
        a cathode,
    the light-emitting layer including multiple light-emitting portions disposed in respective multiple pixels,
    the multiple pixels including a first pixel and a second pixel adjacent to the first pixel,
    the multiple light-emitting portions including a first light-emitting portion that is disposed in the first pixel and a second light-emitting portion that is disposed in the second pixel the first pixel provides a first luminescent color, and the second pixel provides a second luminescent color different from the first luminescent color,
    the first light-emitting portion containing a first luminescent dopant material,
    the second light-emitting portion containing a second luminescent dopant material,
    the concentrations of the first luminescent dopant material in the first light-emitting portion and the second luminescent dopant material in the second light-emitting portion change in the thickness directions of the first light-emitting portion and the second light-emitting portion, respectively, and the concentrations of the first luminescent dopant material in the first light-emitting portion and the second luminescent dopant material in the second light-emitting portion being at respective local maxima in the vicinity of a first interface on the anode side and in the vicinity of a second interface on the cathode side,
    the local maxima in the first light-emitting portion and the second light-emitting portion being, respectively, 20% by weight or higher of the total weights of the first light-emitting portion and the second light-emitting portion obtained in the thicknesses for which the respective concentrations have been measured,
    the first light-emitting portion being provided with, on one of the anode side and the cathode side thereof, a thin mixed layer in which the first luminescent dopant material is mixed with the second luminescent dopant material,
    the concentration of the second luminescent dopant material in the thin mixed layer being smaller than the concentration of the first luminescent dopant material in the thin mixed layer.

2. The organic electroluminescent display panel of claim 1,
    wherein the concentrations of the first luminescent dopant material in the first light-emitting portion and the second luminescent dopant material in the second light-emitting portion are substantially symmetrically distributed in the thickness directions of the first light-emitting portion and the second light-emitting portion, respectively.

3. The organic electroluminescent display panel of claim 2,
    wherein the concentrations of the first luminescent dopant material in the first light-emitting portion and the second luminescent dopant material in the second light-emitting portion continuously decrease from the first and second interface sides to the center portions of the first light-emitting portion and the second light-emitting portion, respectively, and the concentrations of the first luminescent dopant material in the first light-emitting portion and the second luminescent dopant material in the second light-emitting portion are at respective local minima in the center portions, in the respective thickness directions of the first light-emitting portion and the second light-emitting portion.

4. The organic electroluminescent display panel of claim 2,
    wherein the concentrations of the first luminescent dopant material in the first light-emitting portion and the second luminescent dopant material in the second light-emitting portion continuously decrease from the first and second interface sides and show a constant concentration region in a region including the center portions of the first light-emitting portion and the second light-emitting portion, respectively, in the respective thickness directions of the first light-emitting portion and the second light-emitting portion.

5. The organic electroluminescent display panel of claim 4,
    wherein the constant concentration region has a thickness of 20 nm or greater.

6. The organic electroluminescent display panel of claim 1,
    wherein the local maxima in the first light-emitting portion and the second light-emitting portion are, respectively, 50% by weight or higher of the total weights of the first light-emitting portion and the second light-emitting portion obtained in the thicknesses for which the respective concentrations have been measured.

7. The organic electroluminescent display panel of claim 1,
    wherein the local maxima in the first light-emitting portion and the second light-emitting portion are, respectively, lower than 90% by weight of the total of the first light-emitting portion and the second light-emitting portion obtained in the thicknesses for which the respective concentrations have been measured.

8. The organic electroluminescent display panel of claim 1,
    wherein a region having a concentration of each of the first luminescent dopant material in the first light-emitting portion and the second luminescent dopant material in the second light-emitting portion of 20% by weight or higher has a thickness of 10 nm or smaller.

9. The organic electroluminescent display panel of claim 1,
wherein a region having a concentration of each of the first luminescent dopant material in the first light-emitting portion and the second luminescent dopant material in the second light-emitting portion of 50% by weight or higher has a thickness of 5 nm or smaller.

10. The organic electroluminescent display panel of claim 4,
wherein the light-emitting positions in the first light-emitting portion is shifted from the center portion of the first light-emitting portion towards one of the anode side and the cathode side and the light-emitting position in the second light-emitting portion is shifted from the center portion of the second light-emitting portion towards the other one of the anode side and the cathode side.

11. The organic electroluminescent display panel of claim 1,
wherein the first pixel provides the first luminescent color different from a luminescent color of the thin mixed layer.

12. The organic electroluminescent display panel of claim 1,
wherein the thin mixed layer is thinner than the first light-emitting portion.

* * * * *